United States Patent
Suga et al.

(10) Patent No.: US 8,916,019 B2
(45) Date of Patent: Dec. 23, 2014

(54) METHOD FOR MANUFACTURING SOLAR CELL MODULE AND PRECURSOR STRUCTURE FOR SOLAR CELL MODULE

(75) Inventors: Yoshinori Suga, Mishima (JP); Shintaro Inoue, Susono (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 12/677,023

(22) PCT Filed: Sep. 28, 2009

(86) PCT No.: PCT/JP2009/066792
§ 371 (c)(1),
(2), (4) Date: Mar. 7, 2012

(87) PCT Pub. No.: WO2011/036802
PCT Pub. Date: Mar. 31, 2011

(65) Prior Publication Data
US 2012/0168076 A1 Jul. 5, 2012

(51) Int. Cl.
*H01L 31/0232* (2014.01)
*H01L 31/048* (2014.01)
*B32B 17/10* (2006.01)
*H01L 31/052* (2014.01)

(52) U.S. Cl.
CPC ........ *H01L 31/048* (2013.01); *B32B 17/10788* (2013.01); *Y02E 10/52* (2013.01); *H01L 31/0522* (2013.01); *H01L 31/052* (2013.01)
USPC ..................... 156/308.2; 156/308.4; 136/251; 136/256

(58) Field of Classification Search
CPC ............ H01L 31/048; H01L 31/02167; H01L 31/0487; H01L 31/0516; H01L 31/0522; H01L 31/0682; H01L 31/0488; H01L 31/055; H01G 9/2068
USPC ......... 156/308.2, 308.4, 309.9, 312; 136/259, 136/251, 256; 527/432, 433
See application file for complete search history.

(56) References Cited

U.S. PATENT DOCUMENTS 4,235,643 A * 11/1980 Amick .......................... 136/246
5,288,337 A    2/1994 Mitchell (Continued)

FOREIGN PATENT DOCUMENTS

CN    1877865 A    12/2006
EP    1043779 A2    10/2000

(Continued)

OTHER PUBLICATIONS

JP 2001-119054, Uematsu Tsuyoshi, Apr. 27, 2001, Japan Patent office.*

(Continued)

*Primary Examiner* — Joseph S Del Sole
*Assistant Examiner* — Vishal I Patel
(74) *Attorney, Agent, or Firm* — Gifford, Krass, Sprinkle, Anderson & Citkowski, P.C.

(57) ABSTRACT

The present invention aims to provide a method for manufacturing a solar cell module capable of improving positioning accuracy of solar cell elements relative to a light reflection plate. When a solar cell module is manufactured, a corrugated light reflection plate 4 is first prepared by bonding a thermoplastic resin film 7 to a plastic substrate 6. Subsequently, the light reflection plate 4 is set on a lower mold 10, and a thick resin sheet 12 made from an encapsulation resin is arranged on the light reflection plate 4. Then, vacuum suctioning and hot-press processing are performed sequentially, whereby a precursor assembly 13 is formed with the light reflection plate 4 and the resin sheet 12 attached together. Subsequently, a plurality of solar cell elements 2 is placed on an upper surface of the precursor assembly 13. Then, a thin resin sheet 14 made from the encapsulation resin is arranged on the solar cell elements 2, and a front surface plate 3 is arranged on the resin sheet 14. Subsequently, a cross-linking reaction of the encapsulation resin proceeds with a dry laminator, thus the respective solar cell elements 2 are laminated.

12 Claims, 11 Drawing Sheets

(56) References Cited

U.S. PATENT DOCUMENTS

| | | |
|---|---|---|
| 8,039,731 B2 | 10/2011 | Durvasula |
| 2006/0272698 A1 | 12/2006 | Durvasula |
| 2007/0107773 A1 | 5/2007 | Fork et al. |
| 2011/0083717 A1* | 4/2011 | Nishi et al. .................. 136/244 |

FOREIGN PATENT DOCUMENTS

| | | | | |
|---|---|---|---|---|
| EP | 1732141 A1 | 12/2006 | | |
| EP | 2234177 A1 | 9/2010 | | |
| JP | 6061519 A | 3/1994 | | |
| JP | 11-307791 | * 5/1999 | ............. | H01L 31/04 |
| JP | 11307791 A | 11/1999 | | |
| JP | 2001119054 A | 4/2001 | | |
| JP | 2001127331 A | 5/2001 | | |
| JP | 2001210847 A | 8/2001 | | |
| JP | 2006344964 A | 12/2006 | | |
| JP | 2007300128 A | 11/2007 | | |
| JP | 2007-329240 | * 12/2007 | ............ | H01L 31/042 |
| JP | 2007-329240 A | 12/2007 | | |
| WO | WO-9831054 A1 | 7/1998 | | |
| WO | 2008/097517 A1 | 8/2008 | | |
| WO | WO-2009075195 A1 | 6/2009 | | |

OTHER PUBLICATIONS

JP 11-307791, Sakata Hitoshi, Nov. 5, 1999, Japan Patent office.*
Chinese Office Action issued on Sep. 5, 2012, in a counterpart Chinese patent application. No English translation available.
International Preliminary Report on Patentability dated Apr. 11, 2012 for International Application No. PCT/JP2009/066792.
Supplementary European Search Report issued Jul. 11, 2012, from corresponding European Application No. 09 80 7698.

* cited by examiner (a)

(b)

(c)

(d)

(e)

(a)

(b)

(c)

(a)

(b)

(c)

(a)

(b)

(c)

(a)

(b)

(c)

(d)

METHOD FOR MANUFACTURING SOLAR CELL MODULE AND PRECURSOR STRUCTURE FOR SOLAR CELL MODULE

CROSS REFERENCE TO RELATED APPLICATIONS

This application is the U.S. national phase of PCT/JP2009/066792 filed Sep. 28, 2009.

TECHNICAL FIELD

The present invention relates to a method for manufacturing a solar cell module having a solar cell element and a precursor structure for such a solar cell module.

BACKGROUND ART

A solar cell module is conventionally known, which includes a solar cell panel having solar cell elements encapsulated with a transparent resin and a back surface plate arranged on a back surface side of the solar cell panel and having a reflecting structure that reflects light incident to the solar cell panel towards a rear surface side of the solar cell elements, as is disclosed in Patent Literature 1 for example.

CITATION LIST

Patent Literature

Patent Literature 1: Japanese Unexamined Patent Application Publication No. 2001-127331

SUMMARY OF INVENTION

Problem to be Solved by the Invention

As a method of manufacturing a solar cell module such as described in the above conventional art, there is a method, for example, of arranging the transparent resin (encapsulation resin) so that the solar cell elements are interposed between a front surface plate and the back surface plate (light reflection plate) and of laminating the solar cell elements in such a state. However, the encapsulation resin is a soft resin and will thus produce a large flow during molding. Therefore, positioning errors of the solar cell elements are likely to occur when laminating the solar cell elements. Thus, it is difficult to position the solar cell elements relative to the light reflection plate with high accuracy. Poor positioning accuracy of the solar cell elements relative to the light reflection plate leads to a decrease in sunlight collection efficiency of the solar cell elements, which results in a decrease in photovoltaic efficiency.

An object of the present invention is to provide a method for manufacturing a solar cell module capable of improving positioning accuracy of a solar cell element relative to a light reflection plate and provide a precursor structure for such a solar cell module.

Means for Solving the Problem

The present invention provides a method for manufacturing a solar cell module which includes a solar cell element and a light reflection plate having a concavo-convex shape and arranged on a back surface side of the solar cell element so as to reflect sunlight incident from a front surface side of the solar cell element. The method comprising: a first step of bonding a first resin sheet made from an encapsulation resin for securing the solar cell element to the light reflection plate, thus forming a precursor structure; a second step of arranging the solar cell element on a surface of the first resin sheet on a side opposite to the light reflection plate; and a third step of arranging a second resin sheet made from the encapsulation resin so that the solar cell element is interposed between the second resin sheet and the first resin sheet and laminating the solar cell element in the interposed state.

In the method for manufacturing the solar cell module according to the present invention, the precursor structure is formed by bonding the first resin sheet made from the encapsulation resin for securing the solar cell element to the light reflection plate. Due to this configuration, when the solar cell element is subsequently arranged on the surface of the first resin sheet on a side opposite to the light reflection plate, the second resin sheet made from the encapsulation resin is arranged so that the solar cell element is interposed between the second resin sheet and the first resin sheet, the solar cell element is laminated in the interposed state, and a large deformation flow of the encapsulation resin is not likely to occur. Therefore, since a positioning error of the solar cell element is unlikely to occur, it is possible to improve the positioning accuracy of the solar cell element relative to the light reflection plate. Moreover, according to the present invention, it is possible to prevent the occurrence of defects resulting from cracking of the solar cell element.

Preferably, the light reflection plate is obtained by attaching a thermoplastic resin film that forms a light reflection surface reflecting the sunlight to a plastic substrate. In this case, since the first resin sheet is supported by the plastic substrate having rigidity, it is possible to secure a sufficient degree of precision of the concavo-convex shape of the first resin sheet in the precursor structure. Therefore, when the solar cell element is laminated, the positioning error of the solar cell element relative to the light reflection plate is further unlikely to occur. Moreover, it is possible to secure high light collection efficiency.

Furthermore, preferably, in the first step, the precursor structure is formed so that a degree of cross-linking of the encapsulation resin is equal to or less than 30%. In this case, when the solar cell element is subsequently laminated, a cross-linking reaction of the encapsulation resin can proceed without any unevenness. Moreover, it is possible to secure a high bonding strength between the first resin sheet and other encapsulation resins. Therefore, generation of bubbles from the encapsulation resin can be suppressed sufficiently, and thus it is possible to increase the bonding strength between the solar cell element and the encapsulation resin. Furthermore, even when a large thermal stress is applied to the solar cell module, there will be almost no quality trouble resulting from delamination of the encapsulation resin.

A precursor structure for the solar cell module according to the present invention comprises: a light reflection plate having a concavo-convex shape; and a resin sheet made from an encapsulation resin for securing a solar cell element and bonded to the light reflection plate, wherein the resin sheet has an exposed surface on an opposite side of the light reflection plate.

When a solar cell module is manufactured with such a precursor structure for the solar cell module according to the present invention, the solar cell element is arranged on the surface of the resin sheet on a side opposite to the light reflection plate, another resin sheet made from the encapsulation resin is subsequently arranged on the solar cell element, and the solar cell element is laminated in such a state. The use of such a precursor structure for a solar cell module makes a large deformation flow of the encapsulation resin unlikely to occur when the solar cell element is laminated. Therefore, since a positioning error of the solar cell element is unlikely to occur, it is possible to improve the positioning accuracy of the solar cell element relative to the light reflection plate. Moreover, it is possible to prevent an increase in the occurrence rate of defects resulting from cracking of the solar cell element.

Effect of the Invention

According to the present invention, it is possible to improve the positioning accuracy of the solar cell element relative to the light reflection plate. Therefore, sunlight can be effectively collected by the solar cell element, and thus photovoltaic efficiency can be improved.

REFERENCE SINGS LIST

1: SOLAR CELL MODULE
2: SOLAR CELL ELEMENT
3: FRONT SURFACE PLATE
4: LIGHT REFLECTION PLATE
6: PLASTIC SUBSTRATE
7: THERMOPLASTIC RESIN FILM
12: RESIN SHEET (FIRST RESIN SHEET)
13: PRECURSOR ASSEMBLY (PRECURSOR STRUCTURE FOR SOLAR CELL MODULE)
14: RESIN SHEET (SECOND RESIN SHEET)
15: RESIN SHEET
20: SOLAR CELL MODULE
21: SOLAR CELL ELEMENT
22: LIGHT REFLECTION PLATE
23: PLASTIC SUBSTRATE
24: THERMOPLASTIC RESIN FILM
32: PRECURSOR ASSEMBLY (PRECURSOR STRUCTURE FOR SOLAR CELL MODULE)

DESCRIPTION OF EMBODIMENTS

Hereinafter, preferred embodiments of a method for manufacturing a solar cell module and a precursor structure for a solar cell module according to the present invention will be described in detail with reference to the drawings.

Figure 1:
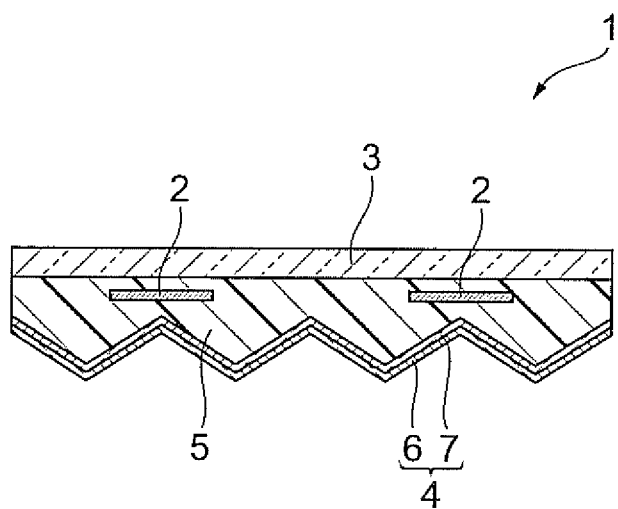
FIG. 1 is a cross-sectional view illustrating a solar cell module that is manufactured by an embodiment of a method for manufacturing a solar cell module according to the present invention.

FIG. 1 is a cross-sectional view illustrating a solar cell module that is manufactured by an embodiment of a method for manufacturing a solar cell module according to the present invention. In this figure, a solar cell module 1 includes a plurality of bifacial photovoltaic solar cell elements 2, a front surface plate 3 arranged on a front surface side of the solar cell elements 2, a light reflection plate 4 having a corrugated (concavo-convex) shape and arranged on a back surface side of the solar cell elements 2 so as to reflect sunlight incident inside the module from the front surface side of the module towards the front surface side of the module, and a resin part 5 made from an encapsulation resin for securing the solar cell elements 2 and arranged between the front surface plate 3 and the light reflection plate 4.

The solar cell elements 2 have an n+/p/p+ junction structure in which an n layer and p layer are formed on a p-type silicon wafer, for example, by diffusing phosphorus and boron, respectively. Each of the solar cell elements 2 is arranged at equal pitches. The front surface plate 3 is formed of a white plate-reinforced glass, for example.

The light reflection plate 4 comprises a plastic substrate 6 which is subjected to corrugated concavo-convex processing and a thermoplastic resin film 7 having a light reflection surface capable of reflecting sunlight and bonded to a surface of the plastic substrate 6. As the plastic substrate 6, a metallic plate made from aluminum, stainless steel, brass, copper, or iron, or an expandable resin sheet having plastically deformable properties can be used.

As the thermoplastic resin film 7, a film having an optical reflectivity of equal to or higher than 80% in a wavelength of 550 nm is preferably used. As such a thermoplastic resin film 7, an evaporation film is used, for example, which uses a biaxially-oriented polyethylene terephthalate film as a base material, which is applied with an acrylic resin or the like having excellent gas barrier properties on the polyethylene terephthalate film as a primer layer and is further coated with a silver or silver alloy by a sputtering method or a vacuum evaporation method. At this time, the film is preferably coated with an acrylic resin or the like as an overcoat layer in order to enhance the corrosion resistance of silver. In addition, in lieu of an evaporation film, a micro-expanded white thermoplastic resin film having an expanded grain size of equal to or less than 30 μm may be used. Furthermore, as a silver alloy, a silver-gold alloy, a silver-platinum alloy, a silver-palladium alloy, and the like are preferred.

As the encapsulation resin that forms the resin part 5, an ethylene vinyl acetate copolymer resin (EVA resin), a polyvinyl butyral resin, a polyethylene resin, and the like, which contains a cross-linking agent, are used, for example.

Figure 2:
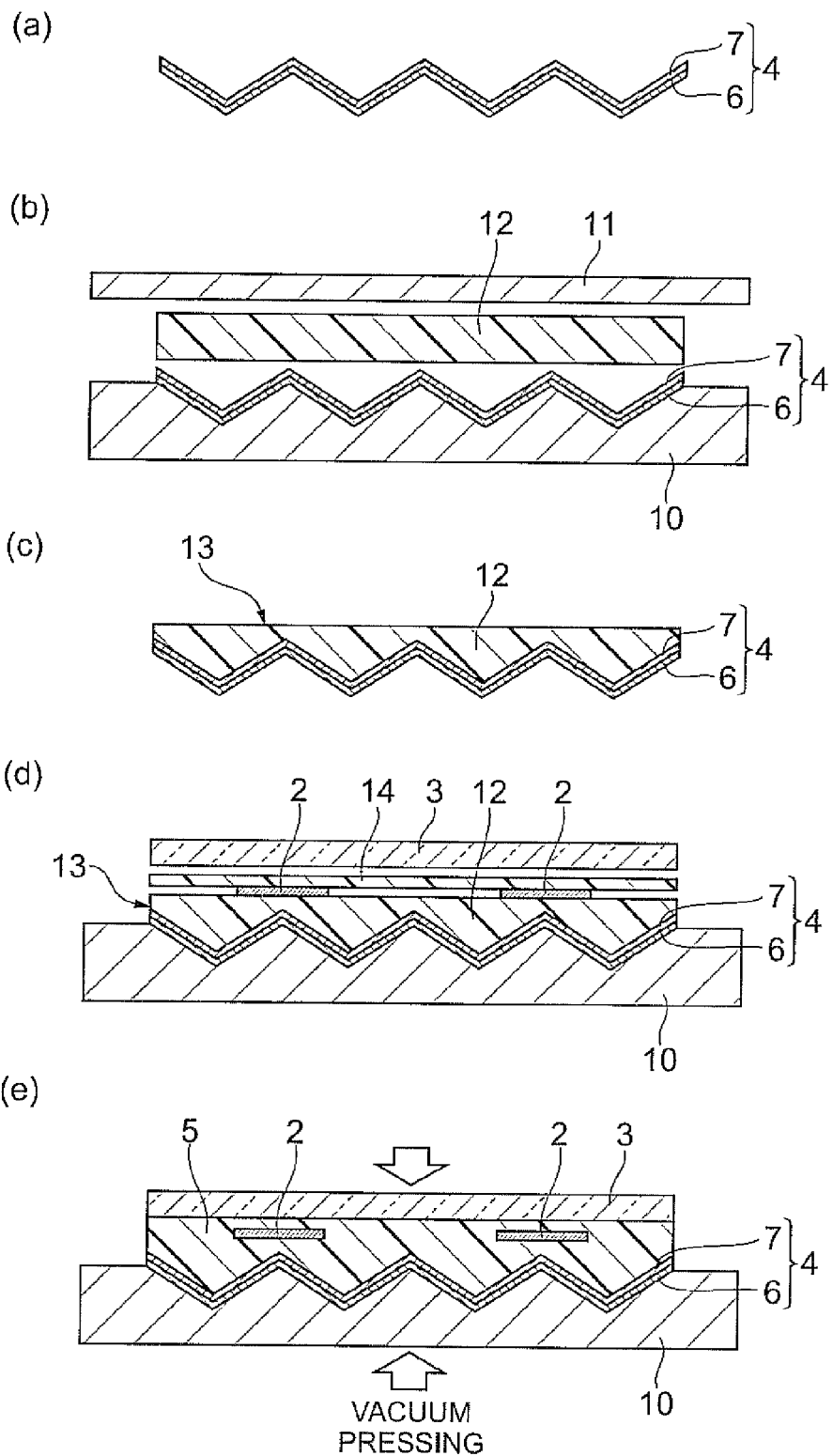
FIG. 2 is a cross-sectional view illustrating the process steps of manufacturing the solar cell module illustrated in FIG. 1.

FIG. 2 is a cross-sectional view illustrating the process steps of manufacturing the solar cell module 1 described above. In this figure, a corrugated light reflection plate 4 is first prepared by attaching the thermoplastic resin film 7 to the plastic substrate 6 (see FIG. 2(a)).

Subsequently, a lower mold 10 having an inner surface which is subjected to concavo-convex processing corresponding to the shape of the light reflection plate 4 and an upper mold 11 having a planar inner surface are prepared. Then, the light reflection plate 4 is set on the lower mold 10, and a thick resin sheet 12 made from an encapsulation resin is arranged on the light reflection plate 4 (see FIG. 2(b)).

Then, vacuum suctioning and hot-press processing are performed sequentially, whereby a molded structure (precursor assembly) 13 is formed with the light reflection plate 4 and the resin sheet 12 attached together (see FIG. 2(c)). At this time, the precursor assembly 13 is formed while controlling the temperature so that the degree of cross-linking of the encapsulation resin that forms the resin sheet 12 is preferably equal to or less than 30%, more preferably equal to or less than 15% and particularly preferably equal to or less than 5%. Here, the degree of cross-linking of the encapsulation resin is defined by a gel fraction when the resin is dissolved in soluble solvent, and a typical method is a quantitative approach that quantizes a gel fraction of the EVA resin with thermal extraction of toluene. The precursor assembly 13 is used as a back sheet in subsequent manufacturing process steps. An upper surface of the precursor assembly 13 (a surface on a side opposite to the light reflection plate 4) is exposed and has a planar shape. In addition, a thickness S (see FIG. 7) of the precursor assembly 13 is preferably equal to or larger than 1 mm and more preferably, equal to or larger than 3 mm. Due to this configuration, it is possible to obtain high light collection efficiency.

Subsequently, the lower mold 10 on which the precursor assembly 13 is placed is set on a heat stage of a vacuum dry laminator. Moreover, a plurality of solar cell elements 2 is mounted on an upper surface of the precursor assembly 13. At this time, the solar cell elements 2 are arranged on the upper surface of the precursor assembly 13 so that the centers of the solar cell elements 2 and the centers of areas between the respective solar cell elements 2 correspond to thin portions of the precursor assembly 13. Moreover, a thin resin sheet 14 made from the above-described encapsulation resin is arranged on the solar cell elements 2, and the front surface plate 3 is arranged on the resin sheet 14 (see FIG. 2(d)).

In such a state, vacuum pressing is performed using a vacuum dry laminator so that a cross-linking reaction of the encapsulation resin proceeds, thus the respective solar cell elements 2 are laminated (see FIG. 2(e)). In this way, the solar cell module 1 described above is obtained.

Figure 3:
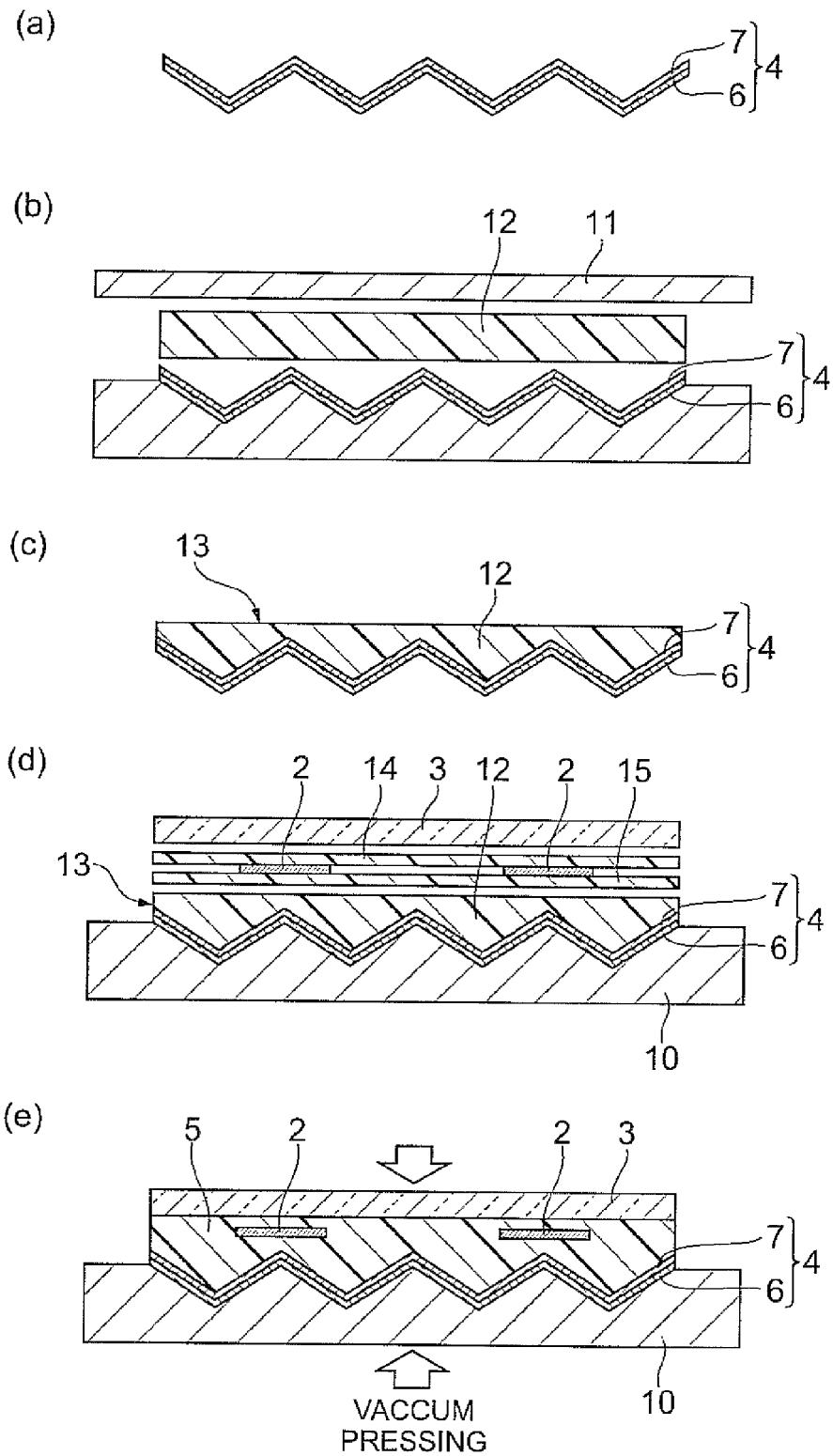
FIG. 3 is a cross-sectional view illustrating a modified embodiment of the process steps of manufacturing the solar cell module illustrated in FIG. 1.

FIG. 3 is a cross-sectional view illustrating a modified embodiment of the process steps of manufacturing the solar cell module 1 illustrated in FIG. 2. Here, the process steps illustrated in FIGS. 3(a) to 3(c) are the same as the process steps illustrated in FIGS. 2(a) to 2(c).

After the precursor assembly 13 illustrated in FIG. 3(c) is formed, a lower mold 10 on which the precursor structure 13 is placed is set on a heat stage of a vacuum dry laminator. Then, a thin resin sheet 15 made from an encapsulation resin is arranged on an upper surface of the precursor assembly 13, and a plurality of solar cell elements 2 is arranged on the resin sheet 15. Moreover, a thin resin sheet 14 made from an encapsulation resin is arranged on the solar cell elements 2, and the front surface plate 3 is arranged on the resin sheet 14 (see FIG. 3(d)).

In such a state, vacuum pressing is performed using a vacuum dry laminator so that a cross-linking reaction of the encapsulation resin proceeds, thus the respective solar cell elements 2 are laminated (see FIG. 3(e)). In this way, the solar cell module 1 described above is obtained.

According to this modified embodiment, since the gap between the thin portions of the precursor assembly 13 and the solar cell elements 2 can be maintained stably, it is possible to sufficiently increase the property of withstanding high voltage resulting from current leaking into the metallic plastic substrate 6, for example. Moreover, since it is possible to increase the bonding strength between the solar cell elements 2 and the encapsulation resin, it is possible to obtain the solar cell module 1 having excellent long-term reliability.

On the other hand, in a solar cell module in which a light reflection plate having a concavo-convex shape is arranged on a back surface side of bifacial photovoltaic solar cell elements so as to cause sunlight to be collected by the solar cell elements, it is necessary to form a concavo-convex structure corresponding to the light reflection plate using a transparent material.

At that time, when a glass material is used as the transparent material, it is very difficult to process such a material into a desired concavo-convex shape, and such a material may increase the weight of the solar cell module. Moreover, a typical glass forming method such as a direct rollout method is not reliable in shape and is inadequate for mass-production. Furthermore, when typical transparent thermoplastic resin such as acrylic resin or polycarbonate resin is used as the transparent material, warp or distortion may occur due to a different linear expansion coefficient from the glass material used for the front surface plate. As a result, large stress may be applied to the solar cell elements, and thus there is a problem in that reliability deteriorates. In addition, in either case, cracks may grow from inflection points of the concavo-convex shape, allowing moisture or oxygen to easily enter into the module and thus deteriorating the durability thereof.

Therefore, it is preferable to use an encapsulation resin such as EVA resin for encapsulating the solar cell elements. However, the encapsulation resin such as EVA resin is a soft transparent resin having excellent flexibility. For this reason, the solar cell elements are likely to be offset by a large flow of the encapsulation resin when the solar cell elements are laminated. Moreover, when the concavo-convex shape is processed using the encapsulation resin, the shape is easily deformed due to stress relaxation or creeping of the encapsulation resin, thus decreasing its ability to maintain its shape. In view of these, it may be difficult to position the solar cell elements relative to the light reflection plate with high accuracy.

In order to secure the shape-maintaining ability of the encapsulation resin, it is necessary to include a cross-linking agent or a radical polymerization initiator in the encapsulation resin. However, in that case, bubbles are likely to be generated when the encapsulation resin is formed to be thick, and the bubbles may cause a light-scattering phenomenon inside the module, thus deteriorating the module performance.

On the contrary, in the present embodiment, the precursor assembly 13 is first formed by bonding the thick resin sheet 12 to the corrugated light reflection plate 4 by hot-press processing. Therefore, when the solar cell elements 2 are subsequently arranged on the precursor assembly 13, and the solar cell elements 2 are laminated in a state such that the thin resin sheet 14 and the front surface plate 3 are sequentially arranged on the solar cell elements 2, the positioning errors of the solar cell elements 2 resulting from a large flow of the encapsulation resin are not likely to occur. Moreover, since the resin sheet 12 is supported by the plastic substrate 6 having rigidity, and the precursor assembly 13 is placed on the lower mold 10 which is subjected to concavo-convex processing corresponding to the light reflection plate 4, a high degree of precision of the encapsulation resin can be secured even when the solar cell elements 2 are laminated. Furthermore, since the precursor assembly 13 is used as a back sheet, almost no unnecessary stress will be applied to the solar cell elements 2. Due to such a configuration, it is possible to maintain the positional relationship of the solar cell elements 2 relative to the light reflection plate 4 with high accuracy. As a result, it is possible to improve the light collection efficiency of the solar cell elements 2 and thus improve the photovoltaic efficiency.

Moreover, since the positional relationship of the solar cell elements 2 relative to the light reflection plate 4 can be maintained with high accuracy, the cross-linking reaction of the encapsulation resin can proceed uniformly without any unevenness at the time of laminating the solar cell elements 2. Therefore, since bubbles are unlikely to be generated in the encapsulation resin, it is possible to sufficiently suppress deterioration of the light collection efficiency resulting from the generated bubbles and delamination of the encapsulation resin from the light reflection plate 4.

In addition, the use of the precursor assembly 13 enables the prevention of fracturing and breaking of a silver-evaporated layer or a silver alloy-evaporated layer and a primer layer which is susceptible to damage due to stress at the time of laminating the solar cell elements 2. For this reason, it is possible to prevent deterioration of the silver-evaporated layer or the silver alloy-evaporated layer due to oxygen or moisture entering therein. Due to this configuration, it is possible to maintain a high optical reflectivity of the light reflection plate 4.

Moreover, since the precursor assembly 13 is used as a back sheet as described above, unnecessary application of stress to the solar cell elements 2 is prevented. For this reason, occurrence of damage, cracking, and bonding defects is suppressed in the solar cell elements 2 due to flow and deformation stress of the encapsulation resin. Therefore, it is possible to improve the quality stability of the solar cell module 1. Moreover, it is possible to produce the solar cell module 1 at low cost and with high productivity.

Furthermore, in a state where the solar cell module 1 is installed, the metallic plastic substrate 6 functions as a heat-dissipation board, so that heat accumulated in the solar cell elements 2 can be dissipated effectively. Due to this configuration, it is possible to prevent a reduction in the photovoltaic efficiency resulting from a temperature rise in the solar cell elements 2.

Moreover, since the light reflection plate 4 is a structure obtained by subjecting the thin plastic substrate 6 to sheet-metal processing, even when the light reflection plate 4 undergoes repeated thermal expansion and contraction, the light reflection plate 4 itself functions as spring to flexibly absorb thermal contraction stress. In addition to this, the soft encapsulation resin has a function of alleviating the thermal contraction stress. For this reason, even when the size of the solar cell module 1 is increased to about 1 m, for example, almost no stress distortion will be accumulated in the module even after the solar cell module 1 is used for a long period of time. Therefore, it is possible to prevent the light reflection plate 4 from being delaminated or cracked, to prevent occurrence of bonding defects of the solar cell elements 2, and to ensure long-term reliability of 20 years or longer.

Due to such a configuration, it is possible to produce the solar cell module 1 with high productivity. Moreover, it is possible to ensure high reliability even after the solar cell module 1 is used for a long period of time.

Furthermore, since occurrence of unnecessary light scattering resulting from different refractive indexes at the interface of the resin part 5 made from the encapsulation resin is suppressed, unlike the case where glass or polycarbonate is used as the transparent material, the amount of light leaking outside the solar cell module 1 is reduced. Therefore, the dazzling feeling when the solar cell module 1 is installed on a roof can be reduced, and thus it is possible to obtain the solar cell module 1 having an excellent appearance quality.

Figure 4:
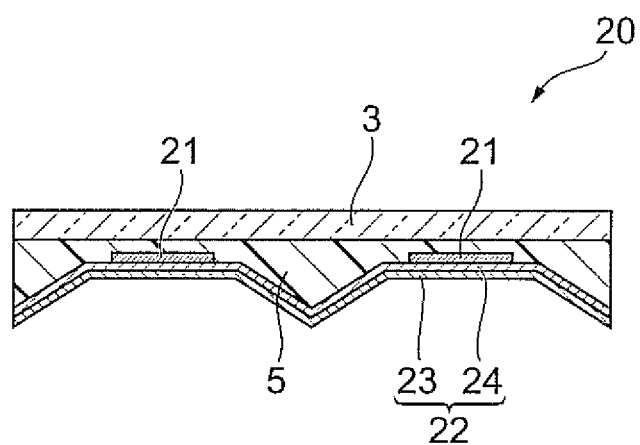
FIG. 4 is a cross-sectional view illustrating another solar cell module that is manufactured by an embodiment of a method for manufacturing a solar cell module according to the present invention.

FIG. 4 is a cross-sectional view illustrating another solar cell module that is manufactured by an embodiment of a method manufacturing a solar cell module according to the present invention. In the drawing, the elements that are the same as or correspond to the solar cell module 1 illustrated in FIG. 1 will be denoted by the same reference signs, and description thereof will be omitted.

In this figure, a solar cell module 20 includes a plurality of single-facial photovoltaic solar cell elements 21, a front surface plate 3 arranged on a front surface side of the solar cell elements 21, a light reflection plate 22 having a concavo-convex shape and arranged on a back surface side of the solar cell elements 21 so as to reflect sunlight incident inside the module from the front surface side of the module towards the front surface side of the module, and a resin part 5 made from an encapsulation resin for securing the solar cell elements 21 and arranged between the front surface plate 3 and the light reflection plate 22.

The solar cell elements 21 have a junction structure in which phosphorus diffusion is performed on a single-crystalline p-type silicon wafer. Each of the solar cell elements 21 is arranged at equal pitches.

The light reflection plate 22 comprises a plastic substrate 23 which is subjected to concavo-convex processing and a thermoplastic resin film 24 having a light reflection surface capable of reflecting sunlight and bonded to a surface of the plastic substrate 23. The light reflection plate 22 is formed with flat portions and V-shaped portions which are adjacent to each other. The materials for the plastic substrate 23 are the same as those of the plastic substrate 6, and the materials for the thermoplastic resin film 24 are the same as those of the thermoplastic resin film 7.

Figure 5:
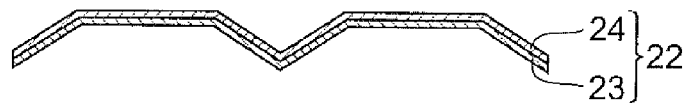
FIG. 5 is a cross-sectional view illustrating the process steps of manufacturing the solar cell module illustrated in FIG. 4.
Figure 5:
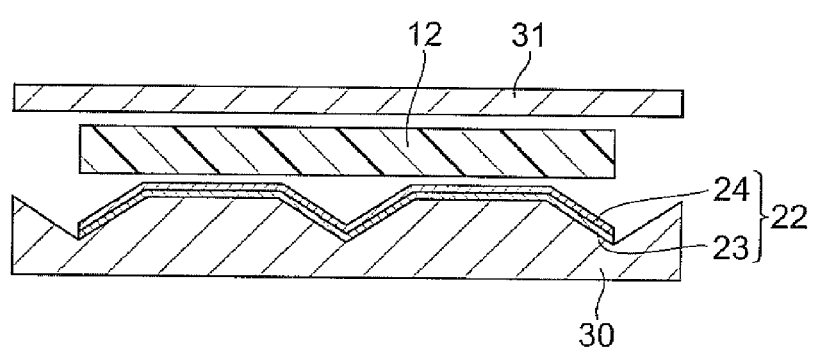
Figure 5:
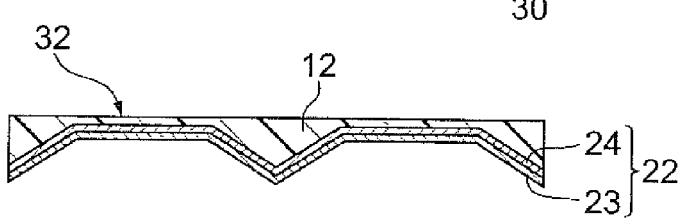
Figure 5:
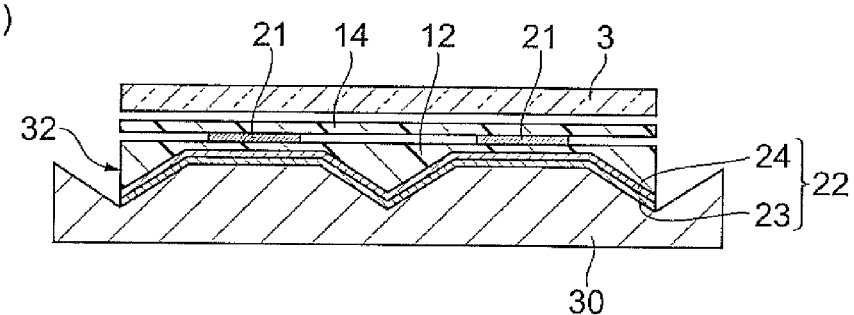
Figure 5:
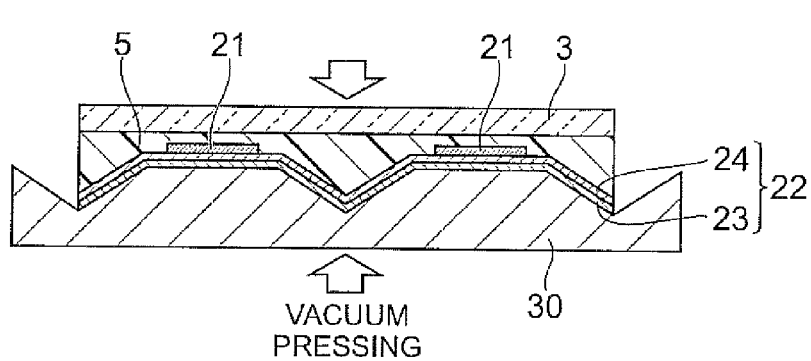

FIG. 5 is a cross-sectional view illustrating the process steps of manufacturing the solar cell module 20 described above. In this figure, a concavo-convex shaped light reflection plate 22 is first prepared by attaching the thermoplastic resin film 24 to the plastic substrate 23 (see FIG. 5(a)).

Subsequently, a lower mold 30 having an inner surface which is subjected to concavo-convex processing corresponding to the shape of the light reflection plate 22 and an upper mold 31 having a planar inner surface are prepared. Then, the light reflection plate 22 is set on the lower mold 30, and a thick resin sheet 12 made from an encapsulation resin is arranged on the light reflection plate 22 (see FIG. 5(b)).

Then, vacuum suctioning and hot-press processing are performed sequentially, whereby a molded structure (precursor assembly) 32 is formed with the light reflection plate 22 and the resin sheet 12 attached together (see FIG. 5(c)). An upper surface of the precursor assembly 32 (a surface on a side opposite to the light reflection plate 22) is exposed and has a planar shape. In addition, the precursor assembly 32 has a structure such that thin portions are formed on the flat portions of the light reflection plate 22.

Subsequently, the lower mold 30 on which the precursor assembly 32 is placed is set on a heat stage of a vacuum dry laminator. Moreover, a plurality of solar cell elements 21 is mounted on an upper surface of the precursor assembly 32. At this time, the solar cell elements 21 are arranged on the upper surface of the precursor assembly 32 so that the solar cell elements 21 correspond to the thin portions of the precursor assembly 32 and the centers of areas between the respective solar cell elements 21 correspond to the thickest portions of the precursor assembly 32. Moreover, a resin sheet 14 is arranged on the solar cell elements 21, and the front surface plate 3 is arranged on the resin sheet 14 (see FIG. 5(d)).

In such a state, vacuum pressing is performed using a vacuum dry laminator so that a cross-linking reaction of the encapsulation resin proceeds, thus the respective solar cell elements 21 are laminated (see FIG. 5(e)). In this way, the solar cell module 20 described above is obtained.

In the process step illustrated in FIG. 5(d), although the solar cell elements 21, the resin sheet 14, and the front surface plate 3 are sequentially stacked on the precursor assembly 32, the resin sheet 15, the solar cell elements 21, the resin sheet 14, and the front surface plate 3 may be sequentially stacked on the precursor assembly 32 similarly to the process step illustrated in FIG. 3(d).

Figure 6:
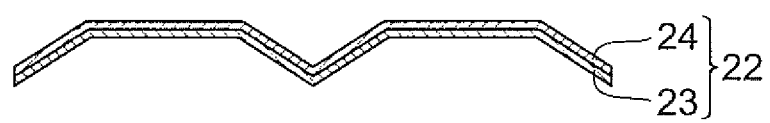
FIG. 6 is a cross-sectional view illustrating a modified embodiment of the process steps of manufacturing the solar cell module illustrated in FIG. 4.
Figure 6:
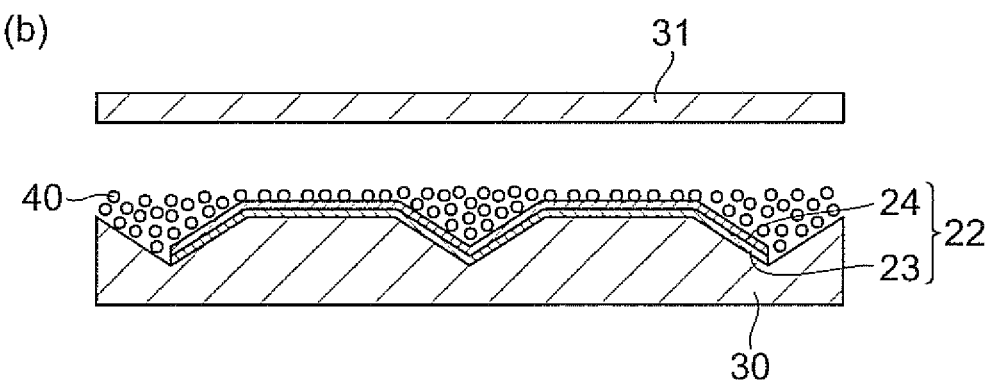
Figure 6:
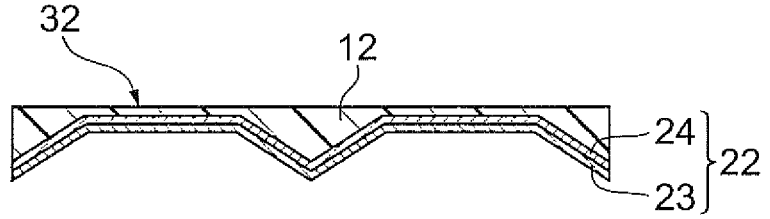

Moreover, when the precursor assembly 32 is obtained, a method of arranging a resin pellet 40 inside a mold cavity to obtain the precursor assembly 32 as illustrated in FIG. 6 may be employed in addition to the method of obtaining the precursor assembly 32 from the resin sheet 12. However, in this case, since bubbles are likely to be introduced compared to the method of using the resin sheet 12 from the starting step, the molding step requires careful attention. That is to say, the method of using the resin sheet 12 from the starting step introduces the least bubbles and is therefore the preferred molding method.

In addition, for an encapsulation resin which can be injection-molded, a method of inserting and molding the light reflection plate 22 into a mold cavity may also be employed as the method of obtaining the precursor assembly 32. However, in this case, careful attention is required because it is difficult to precisely control the degree of cross-linking According to the present embodiment described above, the solar cell module 20 is manufactured using the precursor assembly 32 obtained by bonding the light reflection plate 22 to the resin sheet 12 made from the encapsulation resin. Therefore, similar to the embodiment described above, it is possible to obtain advantages that the positional accuracy of the solar cell elements 21 relative to the light reflection plate 22 can be increased, and thus the light collection efficiency of the solar cell elements 21 can be improved.

Next, Examples of the embodiment will be described.

EXAMPLE 1

First, bifacial photovoltaic solar cell elements (cells) were prepared which have an n+/p/p+ junction structure in which an n layer and p layer are formed on a p-type silicon wafer substrate by diffusing phosphorus and boron, respectively. The solar cell elements had a bifaciality (the percentage of bifacial photovoltaic efficiency) of 0.85, and a front-surface conversion efficiency was 15%. A cell size of the solar cell elements was 15 mm×125 mm×200 μm (thick). The front surface of the solar cell elements was subjected to anti-reflection processing and texturing processing with an optically thin film. That is to say, the solar cell elements had a structure such that photovoltaic loss resulting from a surface reflection loss was reduced.

Moreover, a nickel-plated copper inter-connector of 2 mm width was soldered to the solar cell elements by a lead-free tin-silver-copper based solder, whereby 3-series cell strings were prepared. At that time, the respective solar cell elements were spaced apart from each other so that an arrangement pitch of the solar cell elements was set to 30 mm.

Figure 8:
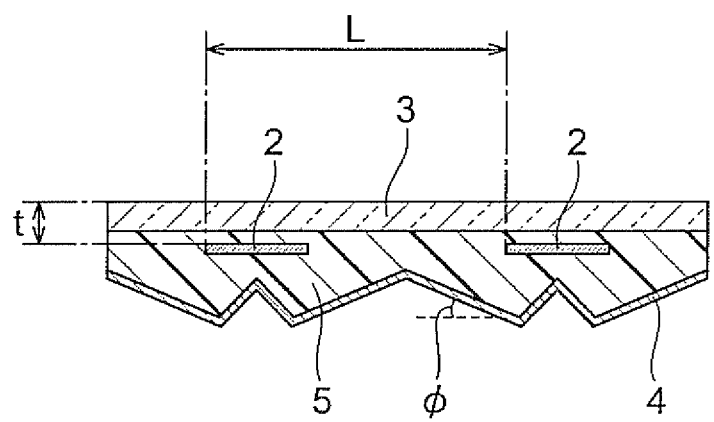
FIG. 8 is a cross-sectional view illustrating parameters of a solar cell module.

Moreover, as illustrated in FIG. 2, a corrugated (concavo-convex shaped) light reflection plate, which is obtained by attaching a thermoplastic resin film (light reflection film) having undergone silver-alloy evaporation and an aluminum substrate (metal substrate), was prepared by sheet-metal processing. At that time, an inclination angle φ (see FIG. 8) of the light reflection plate was 32°.

The thickness of the aluminum substrate is preferably 0.08 mm to 0.25 mm, more preferably 0.10 mm to 0.20 mm, particularly preferably 0.12 mm to 0.18 mm. As the light reflection film, one was used which uses a biaxially-oriented polyethylene terephthalate film made from an acrylic light-curing resin having been subjected to primer processing as a base material, which is subjected to sputtering with a silver-palladium alloy to a thickness of about 110 nm by a roll-to-roll method, and in which an overcoat layer made from an acrylic light-curing resin is arranged on the sputtering layer. As the light reflection film, one having a light reflection layer with an optical reflectivity of equal to or higher than 91% in a wavelength of 550 nm is preferred.

At this time, in lieu of the aluminum substrate, a 0.25 mm-thick resin sheet having excellent plastic properties may be used, which is made from micro-expanded polyethylene terephthalate and subjected to shaping processing. In this case, it is possible to achieve a lighter weight and increase anti-leak properties against unexpected external high voltage application such as lightning.

In the sheet-metal processing of the light reflection plate, it is preferable to apply weak R-processing so as to suppress degradation of the appearance quality due to dazzling, reduce damage to a silver alloy-evaporated layer and a primer layer resulting from occurrence of micro-cracks in a bending processed portion, and prevent oxidation degradation of the silver alloy-evaporated layer over a long period of time. For example, press processing is performed so that an R-shape of R=0.12 mm is applied to the evaporation layer.

Subsequently, as illustrated in FIG. 2, in order to process a concavo-convex shape corresponding to the light reflection plate, a female aluminum mold was prepared, the surface of which has been subjected to a demolding process with fluorine resin (PTFE). Subsequently, the light reflection plate was inserted into a mold cavity. Moreover, as a solar cell encapsulation resin, a thick sheet made from an ethylene vinyl acetate copolymer resin (EVA resin), in which a cross-linking agent and a radical polymerization initiator are dispersed, was set on the mold. Then, vacuum suction was performed, followed by hot-press processing at a temperature of 90° C. which is equal to or higher than a thermal deformation temperature of the EVA resin and equal to or lower than a cross-linking starting temperature. In this way, a molded structure (precursor assembly) in which the light reflection plate and a low cross-linked EVA resin are attached together was obtained while controlling the temperature so that a degree of cross-linking of the EVA resin measured with a solvent extraction method using toluene was at least 30% or lower, preferably 15% or lower and more preferably 5% or lower.

Figure 7:
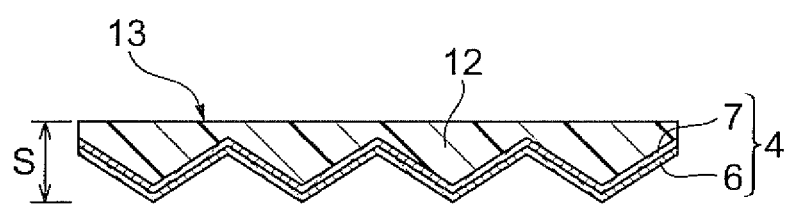
FIG. 7 is a cross-sectional view illustrating an embodiment of a precursor structure for a solar cell module according to the present invention.

As illustrated in FIG. 7, the precursor assembly had a maximum thickness of about 7 mm, and the EVA resin still remained at the thinnest portions. This was to ensure an appropriate gap between the metal substrate where voltage leaks occur easily and the inter-connector portion where high voltage is applied, thus ensuring stable device quality even in a mega solar cell module to which high voltage is applied. At this time, the thickness of the EVA resin at the thinnest portions is preferably 0.2 mm or higher, more preferably 0.4 mm or higher and most preferably 0.6 mm or higher.

Subsequently, a solar cell module was produced using the precursor assembly obtained in the above way as a back sheet. Specifically, a female mold which had been subjected to concavo-convex processing was set on a heat stage of a dry laminator so as to retain the shape of the precursor assembly. Moreover, as illustrated in FIG. 2, the cell strings were set on the precursor assembly, and an EVA resin sheet of about 0.6 mm thickness was arranged thereon, and a front surface plate made from a 4.0 mm-thick white plate-reinforced glass was arranged on the uppermost surface. As the front surface plate, it is preferable to use one having a smooth and rough uneven concavo-convex surface (an index Ra/Sm defined by an arithmetic mean roughness Ra and a mean spacing Sm of the rough surfaces is 0.7, preferably 0.45) in order to secure a balance performance between a bonding strength and a light collecting performance. Moreover, vacuum-dry lamination was conducted under a hot-press condition of 140° C. using a dry laminator so that a cross-linking reaction of the EVA resin proceeded, whereby a solar cell module was obtained.

As described above, since in this Example, the precursor assembly in which the cross-linking reaction does not proceed is used as the back sheet, the stress applied to the cell strings during the vacuum-dry lamination step of the cell strings can be reduced. Moreover, the mold which has been subjected to concavo-convex processing corresponding to the light reflection plate performs a function of retaining the shape of the solar cell encapsulation resin at the time of laminating the cell strings. For this reason, the positional relationship between the cell strings and the light reflection plate can be maintained with high accuracy. Due to this configuration, the cross-linking reaction of the EVA resin can proceed uniformly without any unevenness, and the reduction of the light collection efficiency resulting from the generation of bubbles from the EVA resin can be suppressed sufficiently. Thus, it is possible to obtain a solar cell module having a high photovoltaic performance. Moreover, since no unnecessary stress will be applied to the cell strings during the manufacturing steps of the solar cell module, it is possible to prevent defective units associated with in-process defects resulting from the cracking of cells or distortion of the strings.

Moreover, since fracturing or breaking of the silver alloy-evaporated layer and the primer layer which are susceptible to damage due to stress is prevented from occurring at the time of laminating the solar cell module, it is possible to prevent deterioration of the silver-evaporated layer due to oxygen or moisture entering through cracks. Due to this configuration, it is possible to ensure the long-lasting quality of the silver alloy-evaporated film which is obtained with a roll-to-roll film-formation method.

Furthermore, the metal substrate performs the function (creep-preventing function) of retaining the shape of the solar cell encapsulation resin and the role as a heat sink. For this reason, even when the solar cell module is used in areas such as a desert where a temperature difference is extremely large, the shape of a light collecting portion can be maintained with sufficient precision over a long period of time. Moreover, the cell temperature can be maintained low. Therefore, the reduction of photovoltaic efficiency is sufficiently small.

Here, an inclination angle of the light reflection plate is an important factor because it dominates the photovoltaic efficiency. In particular, highly accurate control of the inclination angle $\phi$ (see FIG. 8) of the light reflection plate at a gap (cell gap) between cells is very important in securing practical photovoltaic efficiency. The inclination angle $\phi$ of the light reflection plate at the cell gap is preferably determined using $\theta$ defined by the following expression while considering a balance between the light collection efficiency and molding stability using the precursor assembly and suppression of the hot spot phenomenon resulting from uniform irradiation of cells with sunlight.

$$\frac{L}{2a} + \frac{L}{2} - \tan 2\theta \left\{ 2t + \tan\theta \left( \frac{L}{2} - \frac{L}{2a} \right) \right\} = 0 \quad \text{[Expression 1]}$$

where, at least $0.5 \times \arcsin(n^{-1}) < \phi < \theta + 15°$ preferably, $0.5 \times \arcsin(n^{-1}) + 2° < \phi < \theta + 12°$ more preferably, $0.5 \times \arcsin(n^{-1}) + 3° < \phi < \theta + 7°$ extremely preferably, $\theta - 3° < \phi < \theta + 5°$ most preferably, $\theta - 2° < \phi < \theta + 2°$ In the equation, a is a light collecting magnification in the arrangement direction of the solar cell elements (cells), namely a value defined as (cell arrangement pitch)/(cell width). n is a refractive index of glass material that forms the front surface plate. L is an arrangement pitch of the cells. t is a value defined as a front surface-side clearance from a light receiving surface of a cell to the surface of the front surface plate (see FIG. 8).

A typical example is that a=2, n=1.49, L=30 mm, and t=4.5 mm. Moreover, the inclination angle $\phi$ is chosen as a solution of the relational expression within a range of 0° to 90°. Specifically, with the above-mentioned numerical values, the inclination angle $\phi$ is shape-controlled at least in a range of 21° to 45°, preferably 23° to 41°, more preferably 24° to 36°, extremely preferably 27° to 35° and most preferably 28° to 32°. Here, it is important that the light reflection plate is shape-controlled within the range of the angle $\phi$ over most of the cell gap areas. For example, the shape of the light reflection plate is processed so that at least 80% of the cell gap areas belongs to that angle range.

According to the solar cell module produced through the above-described process steps, the optical light collection efficiency can be maintained stably over a long period of time as described above. Moreover, the inclination of the light reflection plate is set appropriately. Thus, the light confining effect is increased. Therefore, even when the solar cell module is installed outdoors, the feeling of dazzling from the light reflection plate is reduced, and the appearance quality is excellent.

EXAMPLE 2

First, single-facial solar cell elements (cells) were prepared which had a junction structure in which phosphorus diffusion was performed on a 200 μm-thick single-crystalline p-type silicon wafer by thermal diffusion. The front surface of the solar cell elements was subjected to texturing processing with etching, passivation processing with SiN, and anti-reflection processing. A back surface field structure was formed on the back surface of the solar cell elements by thermal diffusion of aluminum electrodes. On the front surface of the solar cell elements, silver-made finger electrodes were formed by a screen printing method, and the electrodes were bonded through a fire-through process. The conversion efficiency of the solar cell elements was 17.1%. The solar cell elements were cut by a dicing machine using a diamond blade so that the cell size became 15 mm×125 mm. Moreover, an interconnector made from a planar tin-plated copper wire was soldered to the solar cell elements by a reflow method so that a gap (cell gap) between the solar cell elements was 15 mm, whereby 3-series cell strings were prepared.

Moreover, as illustrated in FIG. 5, a light reflection plate was prepared having a structure in which a plastically deformable substrate was bonded to a light reflection film. As the plastically deformable substrate, a metal substrate made from aluminum, brass, stainless steel, copper, or the like, or a low-expandable polypropylene sheet and a low-expandable polyethylene terephthalate sheet having an independent bubble structure are used. The thickness of the substrate is preferably 0.08 mm to 0.25 mm, more preferably 0.10 mm to 0.20 mm and particularly preferably 0.12 mm to 0.18 mm.

As the light reflection film bonded to the substrate, a thermoplastic resin film on which high-reflectivity metal such as silver, silver alloy, aluminum, or chrome is evaporated, a white thermoplastic resin film such as polyethylene terephthalate in which white pigments such as talc, titania, or mica, or fluorescent whitening agent is mixed, and a white thermoplastic resin film in which micro-expandable structures are formed by a supercritical blowing method using carbon dioxide and a blowing agent such as azodicarbonamide. Particularly, as such a thermoplastic resin film, a film is preferred which uses a biaxially-oriented polyethylene terephthalate film made from an acrylic light-curing resin having been subjected to primer processing as a base material, which is subjected to sputtering with a silver alloy having excellent anti-corrosion properties by a roll-to-roll method, and in which an overcoat layer made from an acrylic light-curing resin is arranged on the sputtering layer. At this time, a silver-palladium alloy, a silver-gold alloy, a silver-platinum alloy, or the like was used as the silver alloy having excellent anti-corrosion properties, which was sputtered to a thickness of 70 nm or more and preferably 90 mm or more.

As the light reflection film, one having a light reflection layer with an optical reflectivity of equal to or higher than 91% in a wavelength of 550 nm is preferred. In this case, the acrylic light-curing resin having excellent gas barrier properties can effectively prevent the spreading of oxygen or moisture which may become a trigger of deterioration. For this reason, the silver alloy-evaporated layer can be firmly isolated from deterioration components. Moreover, because of the excellent flexibility of the acrylic light-curing resin, even when the light reflection plate is subjected to bending processing many times in order to form a light collection structure, no gas can pass through the bent portions. Therefore, it is possible to enhance the long-term durability of the light reflection plate. Moreover, an acrylic heat-curing resin, for example, may be used as long as it is a primer having flexibility and excellent gas barrier properties.

Furthermore, as the light reflection film, one is further preferable in which an optically thin film comprised of a metal layer, a low-refractive layer, and a high-refractive layer, in the order of silica and titania, for example, is processed on a light reflection surface as a reflectivity-enhancing structure. By doing so, it is possible to obtain even higher photovoltaic efficiency. Moreover, it is possible to obtain a metal evaporated layer having high durability.

Moreover, urethane-based adhesive is preferably used for attachment of the metal substrate and the light reflection film. In this case, since both members can be bonded strongly, the occurrence of micro-voids resulting from delamination or cracking associated with stress during sheet-metal processing can be prevented. Thus, there will be no harmful effect on the voltage-withstanding characteristics and tracking-resistance characteristics.

When a general press processing method is used for the sheet-metal processing of the light reflection plate, delamination, fracturing or breaking of a thin evaporation layer may occur, and thus optical reflectivity may decrease easily. For this reason, as the shaping processing of the light reflection plate, processing such as press brake processing that, as much as possible, does not apply drawing deformation (tensile stress) to the light reflection plate is performed so that an evaporation layer is not damaged. At that time, if simple bending processing that processes a surface to have acute edges is performed on the bent portion of the light reflection plate, light can scatter easily, which may degrade the appearance quality, thus reducing the commercial value. In addition to such an adverse effect, since a primer layer or an overcoat layer that protects an existing silver evaporated layer will be destroyed, moisture or oxygen can easily enter deep into the silver evaporated layer through micro-cracks, which may easily lead to a reduction in the optical reflectivity. Therefore, such a light reflection plate will be useless as a light reflection plate of a solar cell module which is required to have durability lasting over 20 years.

Therefore, the light reflection plate formed of a bonded structure of the metal substrate (plastic substrate) and the light reflection film was processed so that an R portion having a radius of curvature of at least 0.005 mm or more, preferably 0.01 mm or more and more preferably 0.05 mm or more is formed in a silver evaporated layer of a bent portion, in order to prevent the occurrence of micro-cracks. By doing so, it is possible to improve the appearance quality of the light reflection plate. In this example, a light reflection plate was obtained in which an R portion having R=0.09 mm was applied to each bent portion.

Subsequently, as illustrated in FIG. 5, in order to process a concavo-convex shape corresponding to the light reflection plate, a female copper mold was prepared, the surface of which had been subjected to a demolding process with fluorine resin (PTFE). Subsequently, the light reflection plate was inserted into a mold cavity. Moreover, as a solar cell encapsulation resin, a thick sheet made from an ethylene vinyl acetate copolymer resin (EVA resin), in which a cross-linking agent and a radical polymerization initiator are dispersed, was set on the mold. Then, vacuum suction was performed, followed by hot-press processing at a temperature of 90° C. which is equal to or higher than a thermal deformation temperature of the EVA resin and equal to or lower than a cross-linking starting temperature. In this way, a molded structure (precursor assembly) in which the light reflection plate and a low cross-linked EVA resin are attached together was obtained while controlling the temperature so that a degree of cross-linking of the EVA resin measured with a solvent extraction method using toluene is at least 30% or lower, preferably 15% or lower and more preferably 5% or lower.

Subsequently, a solar cell module was produced using the precursor assembly obtained in the above way as a back sheet. Specifically, a female mold which had been subjected to concavo-convex processing was set on a heat stage of a dry laminator so as to retain the shape of the precursor assembly. Moreover, an EVA resin sheet of about 0.6 mm thickness was arranged on the precursor assembly, the cell strings were arranged thereon, an EVA resin sheet of about 0.6 mm thickness was arranged thereon, and finally, a front surface plate made from a white plate-reinforced glass (5 mm thick and refractive index 1.49) was arranged on the uppermost surface. Moreover, vacuum-dry lamination was conducted under a hot-press condition of 140° C. using a dry laminator so that a cross-linking reaction of the EVA resin proceeded, whereby a solar cell module was obtained.

As described above, since also in this Example, the precursor assembly in which the cross-linking reaction does not proceed is used as the back sheet, the stress applied to the cell strings during the lamination step of the cell strings can be reduced. Moreover, the shape of the solar cell encapsulation resin can be maintained with high precision by the mold and the light reflection plate at the time of laminating the cell strings. For this reason, since the positional relationship between the cell strings and the light reflection plate can be maintained with high accuracy, it is possible to obtain a solar cell module having an excellent photovoltaic performance. Moreover, since no unnecessary stress will be applied to the cell strings, it is possible to prevent defective units associated with in-process defects resulting from the cracking of cells or distortion of the strings.

Here, the inclination angle of the light reflection plate at a gap (cell gap) between cells is determined as follows. That is to say, if it is assumed that a light collecting magnification a in the arrangement direction of the solar cell elements (cells) is 2, a refractive index n of the glass material that forms the front surface plate is 1.49, the cell arrangement pitch L is 30 mm, and a front surface-side clearance t from a light receiving surface of a cell to the surface of the front surface plate is 5.5 mm, then the inclination angle φ of the light reflection plate at the cell gap is chosen as a solution of the following expression within a range of 0° to 90°.

$$\frac{L}{2a} + \frac{L}{2} - \tan 2\theta \left\{ 2t + \tan \theta \left( \frac{L}{2} - \frac{L}{2a} \right) \right\} = 0 \qquad \text{[Expression 2]}$$

where, at least $0.5 \times \arcsin(n^{-1}) < \phi < \theta + 15°$ preferably, $0.5 \times \arcsin(n^{-1}) + 2° < \phi < \theta + 12°$ more preferably, $0.5 \times \arcsin(n^{-1}) + 3° < \phi < \theta + 7°$ extremely preferably, $\theta - 3° < \phi < \theta + 5°$ most preferably, $\theta - 2° < \phi < \theta + 2°$ Specifically, the inclination angle φ is shape-controlled at least in a range of 21° to 43°, preferably 23° to 40°, more preferably 24° to 35°, extremely preferably 25° to 33° and most preferably 27° to 31°.

COMPARATIVE EXAMPLE 1

Figure 9:
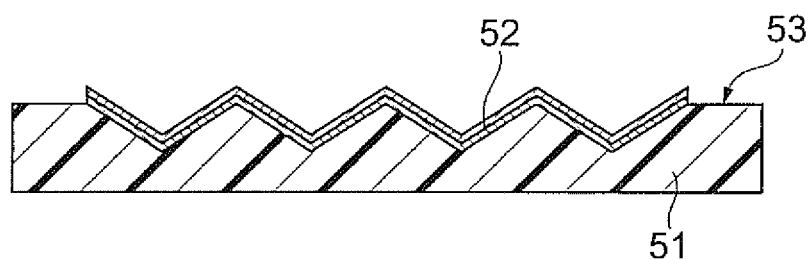
FIG. 9 is a cross-sectional view illustrating a comparative example of the process steps of manufacturing a solar cell module.
Figure 9:
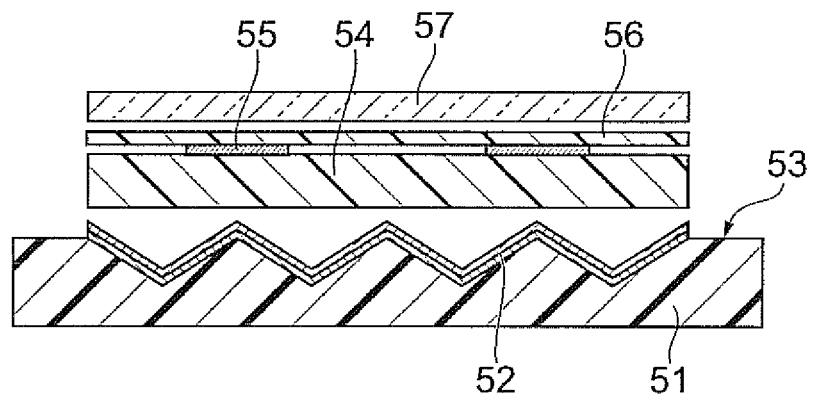
Figure 9:
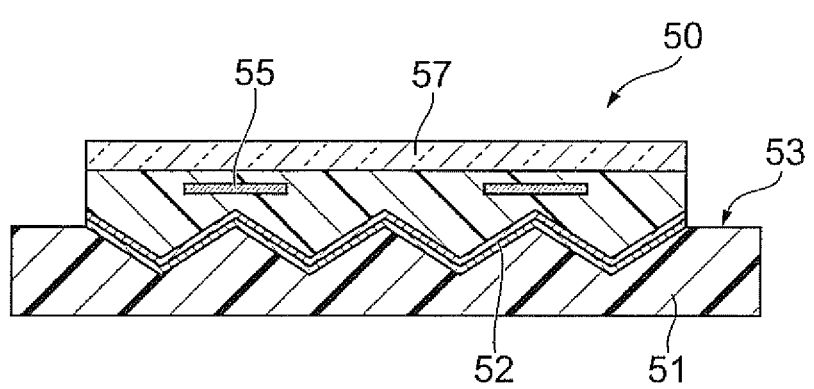

A solar cell module was produced using the same strings and the same light reflection plate as those of the Example 1 described above. Specifically, as illustrated in FIG. 9, a resin substrate 51 made from polycarbonate and a light reflection plate 52 were attached together, whereby a light reflection plate-attached back surface plate 53 was prepared. Moreover, in a state where the back surface plate 53, a thick EVA resin sheet 54, cell strings 55, a thin EVA resin sheet 56, and a front surface plate 57 were arranged inside a vacuum dry laminator, the cell strings 55 were laminated using the vacuum dry laminator, whereby a solar cell module 50 was obtained.

According to such a manufacturing method, since the resin substrate was heavy, a total weight of the solar cell module was increased. For this reason, since an extremely large molding flow occurs in the EVA resin during the lamination step, it is difficult to perform positioning of the cell strings. As a result, it is difficult to secure optical light collection efficiency. Moreover, large warping deformation occurs during the formation of the module due to a different linear expansion coefficient between the light reflection plate-attached back surface plate and the front surface plate, which makes it difficult to increase the size of the solar cell module because of residual stress-related problems. Furthermore, for use in areas such as a desert where a temperature difference is extremely large, delamination problems with the EVA resin occur due to different linear expansion resulting from different temperatures of day and night. Therefore, the solar cell module is inadequate for practical use where the use areas are limited.

COMPARATIVE EXAMPLE 2

Figure 10:
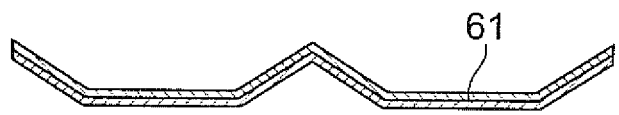
FIG. 10 is a cross-sectional view illustrating another comparative example of the process steps of manufacturing a solar cell module.
Figure 10:
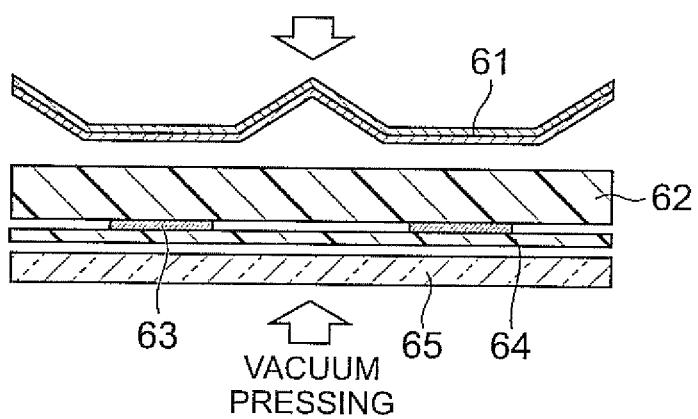
Figure 10:
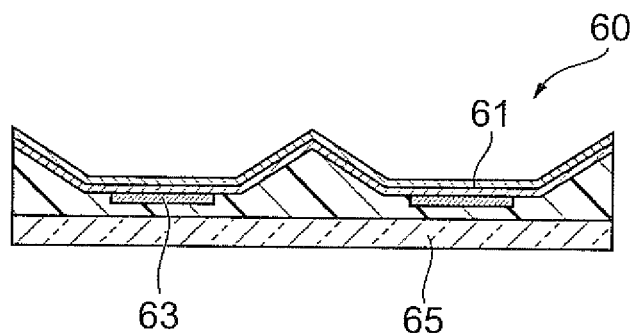

A solar cell module was produced using the same strings and the same light reflection plate as those of the Example 2 described above. Specifically, as illustrated in FIG. 10, a light reflection plate 61 was directly set in a vacuum dry laminator, and in a state where a thick EVA resin sheet 62, cell strings 63, a thin EVA resin sheet 64, and a front surface plate 65 were sequentially arranged inside the vacuum dry laminator, the cell strings 63 were laminated using the vacuum dry laminator that uses a silicon rubber-made diaphragm, whereby a solar cell module 60 was obtained.

According to such a fabrication method, since the light reflection plate having a concavo-convex structure processed by metal-sheet processing was deformed during the lamination step, it was difficult to maintain the shape of the EVA resin necessary for maintaining optical light collection efficiency. Moreover, since the thick EVA resin brings about a large flow, lots of deformation or positioning errors of the cell strings occurred. At this time, if the residual stress is great, cell cracks may occur.

COMPARATIVE EXAMPLE 3

Figure 11:
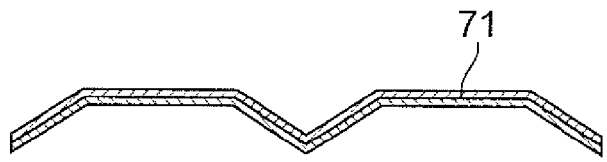
FIG. 11 is a cross-sectional view illustrating still another comparative example of the process steps of manufacturing a solar cell module.
Figure 11:
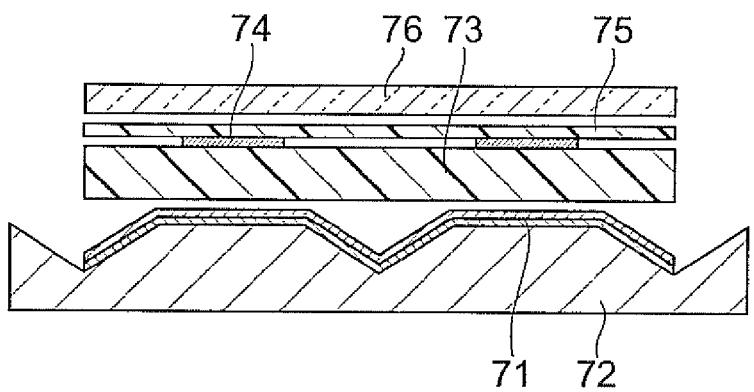
Figure 11:
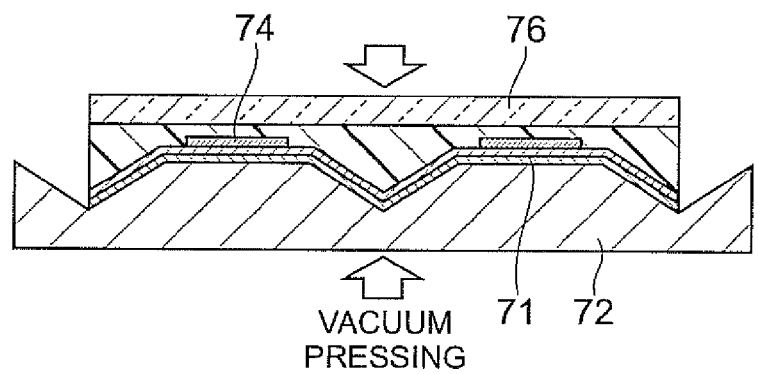
Figure 11:
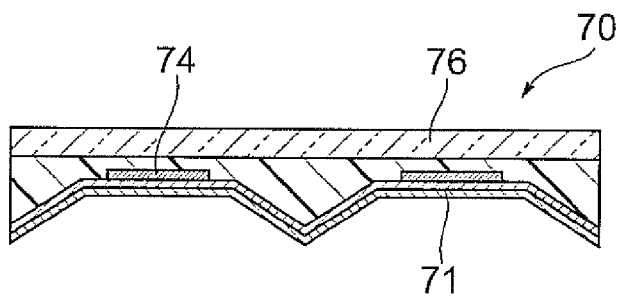

A solar cell module was produced using the same strings and the same light reflection plate as those of the Example 2 described above. Specifically, as illustrated in FIG. 11, a light reflection plate 71 was held on a mold 72 which has been subjected to concavo-convex processing corresponding to the light reflection plate 71 rather than forming the precursor assembly as used in the Example 2, and in a state where a thick EVA resin sheet 73, cell strings 74, a thin EVA resin sheet 75, and a front surface plate 76 were sequentially arranged thereon, the cell strings 74 were laminated using a vacuum dry laminator, whereby a solar cell module 70 was obtained.

According to such a fabrication method, the inclination angle of the light reflection plate was maintained so that optical light collection efficiency could be maintained. However, the cells were offset or cracked when a stress load resulting from a large deformation flow of the EVA resin was applied to the cell strings.

INDUSTRIAL APPLICABILITY

The present invention provides a method for manufacturing a solar cell module and a precursor structure for a solar cell module capable of improving the positioning accuracy of solar cell elements relative to a light reflection plate.

The invention claimed is:
1. A method for manufacturing a solar cell module which includes a solar cell element, the method comprising:
providing a light reflection plate having a concavo-convex shape;
bonding a first resin sheet made from an encapsulation resin for securing the solar cell element to the light reflection plate, thus forming a precursor structure;
arranging the solar cell element on a surface of the precursor structure on a side opposite to the light reflection plate after the bonding; and
arranging a second resin sheet made from the encapsulation resin so that the solar cell element is interposed between the second resin sheet and the precursor structure and laminating the solar cell element in the interposed state;

wherein the light reflection plate is arranged in the solar cell module on a back surface side of the solar cell element so as to reflect sunlight incident from a front surface side of the solar cell element.

2. The method for manufacturing the solar cell module according to claim 1, wherein the light reflection plate is obtained by attaching a thermoplastic resin film that forms a light reflection surface reflecting the sunlight to a plastic substrate.

3. The method for manufacturing the solar cell module according to claim 1, wherein the precursor structure is formed so that a degree of cross-linking of the encapsulation resin is equal to or less than 30%.

4. The method for manufacturing the solar cell module according to claim 2, wherein the precursor structure is formed so that a degree of cross-linking of the encapsulation resin is equal to or less than 30%.

5. The method for manufacturing the solar cell module according to claim 1, wherein the light reflection plate has a cross-sectional concavo-convex shape.

6. A method for manufacturing a solar cell module which includes a solar cell element, the method comprising:
providing a light reflection plate having a concavo-convex shape;
bonding a first resin sheet to the light reflection plate, the first resin sheet being made from an encapsulation resin for securing the solar cell element, thus forming a precursor structure which includes a flat surface on a side facing the first resin sheet and an uneven surface on a side facing the light reflection plate;
arranging the solar cell element on the flat surface of the precursor structure after the bonding;
arranging a second resin sheet made from the encapsulation resin so that the solar cell element is interposed between the second resin sheet and the precursor structure; and
laminating the solar cell element, the second resin sheet, and the precursor structure in the state of which the solar cell element is interposed between the second resin sheet and the precursor structure.

7. The method for manufacturing the solar cell module according to claim 6, wherein the light reflection plate is obtained by attaching a thermoplastic resin film that forms a light reflection surface reflecting the sunlight to a plastic substrate.

8. The method for manufacturing the solar cell module according to claim 7, wherein the thermoplastic resin film includes a biaxially-oriented polyethylene terephthalate film and an acrylic resin on the polyethylene terephthalate film.

9. The method for manufacturing the solar cell module according to claim 6, wherein the precursor structure is formed so that a degree of cross-linking of the encapsulation resin is equal to or less than 30%.

10. The method for manufacturing the solar cell module according to claim 6, wherein the precursor structure includes a first portion and a second portion, the first portion comparatively thinner than the second portion.

11. The method for manufacturing the solar cell module according to claim 10, wherein the solar cell element is arranged on the first thinner portion of the precursor structure.

12. The method for manufacturing the solar cell module according to claim 6, further comprising:
arranging a front surface plate on the second resin sheet on an opposite side to the solar cell element.

* * * * *